(12) United States Patent
Adachi

(10) Patent No.: US 10,661,735 B2
(45) Date of Patent: May 26, 2020

(54) CABLE CONNECTING STRUCTURE

(71) Applicant: TOYOTA JIDOSHA KABUSHIKI KAISHA, Toyota-shi, Aichi-ken (JP)

(72) Inventor: Satoshi Adachi, Nagoya (JP)

(73) Assignee: TOYOTA JIDOSHA KABUSHIKI KAISHA, Toyota-shi, Aichi-ken (JP)

( * ) Notice: Subject to any disclaimer, the term of this patent is extended or adjusted under 35 U.S.C. 154(b) by 0 days.

(21) Appl. No.: 16/434,663

(22) Filed: Jun. 7, 2019

(65) Prior Publication Data
US 2019/0375351 A1 Dec. 12, 2019

(30) Foreign Application Priority Data
Jun. 11, 2018 (JP) .................................. 2018-110927

(51) Int. Cl.
| | |
|---|---|
| H01R 4/70 | (2006.01) |
| B60R 16/03 | (2006.01) |
| B60K 7/00 | (2006.01) |
| B62D 5/04 | (2006.01) |
| H01R 11/12 | (2006.01) |
| H01R 9/18 | (2006.01) |
| H05K 9/00 | (2006.01) |
| H01B 9/02 | (2006.01) |

(Continued)

(52) U.S. Cl.
CPC ............ *B60R 16/03* (2013.01); *B60K 7/0007* (2013.01); *B62D 5/0418* (2013.01); *H01R 4/70* (2013.01); *H01R 9/18* (2013.01); *H01R 11/12* (2013.01); *H01B 9/024* (2013.01); *H01R 13/562* (2013.01); *H01R 2201/26* (2013.01); *H02G 3/0616* (2013.01); *H05K 9/0098* (2013.01)

(58) Field of Classification Search
CPC ...... H01G 3/0616; H01R 13/562; H01R 4/70; H01B 9/024
See application file for complete search history.

(56) References Cited

U.S. PATENT DOCUMENTS

| | | | | |
|---|---|---|---|---|
| 5,300,734 A | * | 4/1994 | Suzuki .................. | H01R 13/56 174/135 |
| 5,380,224 A | * | 1/1995 | DiCicco .................. | H01R 4/70 439/447 |

(Continued)

FOREIGN PATENT DOCUMENTS

JP 2005-104386 A 4/2005

*Primary Examiner* — Tho D Ta
(74) *Attorney, Agent, or Firm* — Sughrue Mion, PLLC

(57) ABSTRACT

A cable connecting structure for connecting a power supplying cable to a terminal-block-side terminal in a terminal block provided on one of an electric-motor side and a power-source side, wherein the power supplying cable includes a conductive wire, a covering, and a cable-side terminal, wherein a protective cover is provided so as to allow the power supplying cable to be disposed therein in a state in which the protective cover is contracted while one end thereof is fixed to the covering outside the terminal block and the other end thereof is held in engagement with the terminal block, and wherein, when the conductive wire and the terminal are disconnected from each other and the power supplying cable is accordingly withdrawn from the terminal block, the protective cover extends such that the other end thereof goes beyond a distal end of the power supplying able.

5 Claims, 4 Drawing Sheets

(51) Int. Cl.
*H02G 3/06* (2006.01)
*H01R 13/56* (2006.01)

(56) References Cited

U.S. PATENT DOCUMENTS

| | | | | |
|---|---|---|---|---|
| 5,876,069 A | * | 3/1999 | Kobayashi | H01R 13/562 |
| | | | | 285/226 |
| 6,126,477 A | * | 10/2000 | Smith | H01R 13/6592 |
| | | | | 439/447 |
| 6,479,773 B2 | * | 11/2002 | Bienvenu | H01R 13/2421 |
| | | | | 200/239 |

* cited by examiner

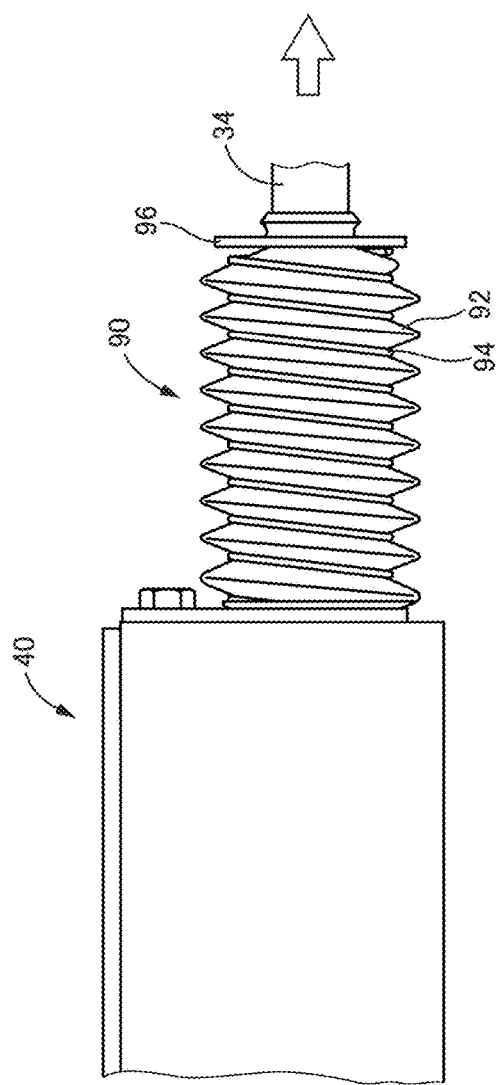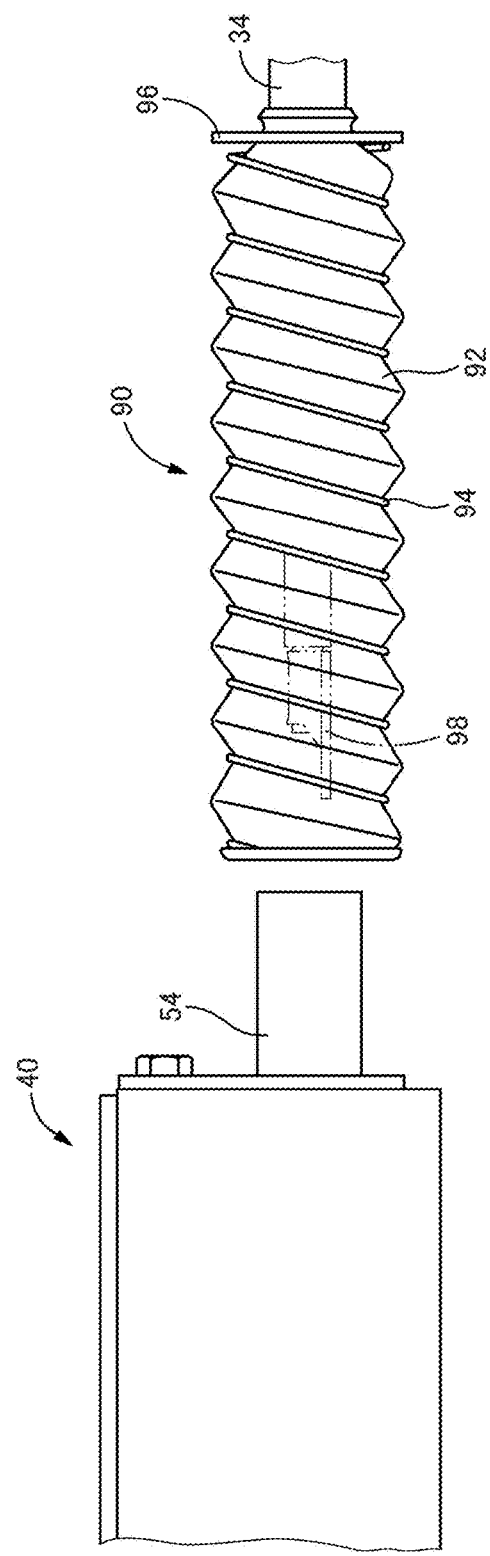

CABLE CONNECTING STRUCTURE

CROSS REFERENCE TO RELATED APPLICATION

The present application claims priority from Japanese Patent Application No. 2018-110927, which was filed on Jun. 11, 2018, the disclosure of which is herein incorporated by reference in its entirety.

BACKGROUND

Technical Field

The following disclosure relates to a cable connecting structure for a power supplying cable that connects an in-wheel motor and a power source that is provided on a body of a vehicle, the cable connecting structure being for connecting the power supplying cable to a terminal in a terminal block provided on one of a motor side and a power-source side.

Description of Related Art

In the field of automobiles, there has been proposed to dispose, in a wheel, an electric motor configured to drivingly rotate the wheel, namely, employment of an in-wheel motor has been proposed. Electric current is supplied to the electric motor from a power source that includes a battery, a drive circuit, and so on. Thus, the electric motor and the power source are connected by a power supplying cable. In the case where the power supplying cable is damaged in a collision of the vehicle, for instance, it is expected that sparks are generated due to an electric discharge. In view of this, Japanese Patent Application Publication No. 2005-104386 proposes provision of a protective cover to protect the power supplying cable.

SUMMARY

In general, the power supplying cable is connected to terminal blocks respectively on an electric-motor side and a drive-circuit side in the vehicle. When an excessively large tension acts on the power supplying cable, the power supplying cable might be withdrawn from any one of the terminal blocks though the power supplying cable itself is not damaged. In this case, when a distal end of the withdrawn power supplying cable comes into contact with some component of the vehicle, it is expected that an electric discharge occurs at the distal end. The protective cover described in the Patent Publication, however, is not intended to deal with such withdrawal of the power supplying cable from the terminal block. Thus, it is possible to enhance utility of the connecting structure for the power supplying cable by preventing an electric discharge that arises from the withdrawal of the power supplying cable. Accordingly, the present disclosure is directed to a cable connecting structure having high utility.

One aspect of the disclosure relates to a cable connecting structure for a power supplying cable used for supplying an electric current from a power source provided on a body of a vehicle to an electric motor that is disposed in a wheel of the vehicle and that is configured to drivingly rotate the wheel. The cable connecting structure is for connecting the power supplying cable to a terminal-block-side terminal in a terminal block provided on one of an electric-motor side and a power-source side. The power supplying cable includes a conductive wire, a covering that covers the conductive wire except for a distal end portion of the conductive wire, and a cable-side terminal attached to the distal end portion of the conductive wire. The conductive wire is connected to the terminal-block-side terminal such that the cable-side terminal and the terminal-block-side terminal are fastened to each other. A protective cover having a cylindrical shape is provided so as to allow the power supplying cable to be disposed therein in a state in which the protective cover is contracted while one end of the protective cover is fixed to the covering outside the terminal block and the other end of the protective cover is held in engagement with the terminal block. When the conductive wire and the terminal-block-side terminal are disconnected from each other and the power supplying cable is accordingly withdrawn from the terminal block, the protective cover extends such that the other end thereof goes beyond a distal end of the power supplying cable.

Advantageous Effects

According to the cable connecting structure constructed as described above, even if the power supplying cable is withdrawn from the terminal block, the protective cover prevents the distal end of the power supplying cable from coming into contact with other member of the vehicle, thus preventing occurrence of the electric discharge at the distal end. Accordingly, the cable connecting structure of the present disclosure has high utility.

BRIEF DESCRIPTION OF THE DRAWINGS

The objects, features, advantages, and technical and industrial significance of the present disclosure will be better understood by reading the following detailed description of an embodiment, when considered in connection with the accompanying drawings, in which:

FIGS. 4A and 4B are views each for explaining an action of a protective cover of the cable connecting structure according to the embodiment in the case where the power supplying cable is withdrawn from the terminal block.

FORMS OF THE INVENTION

Figure 1:
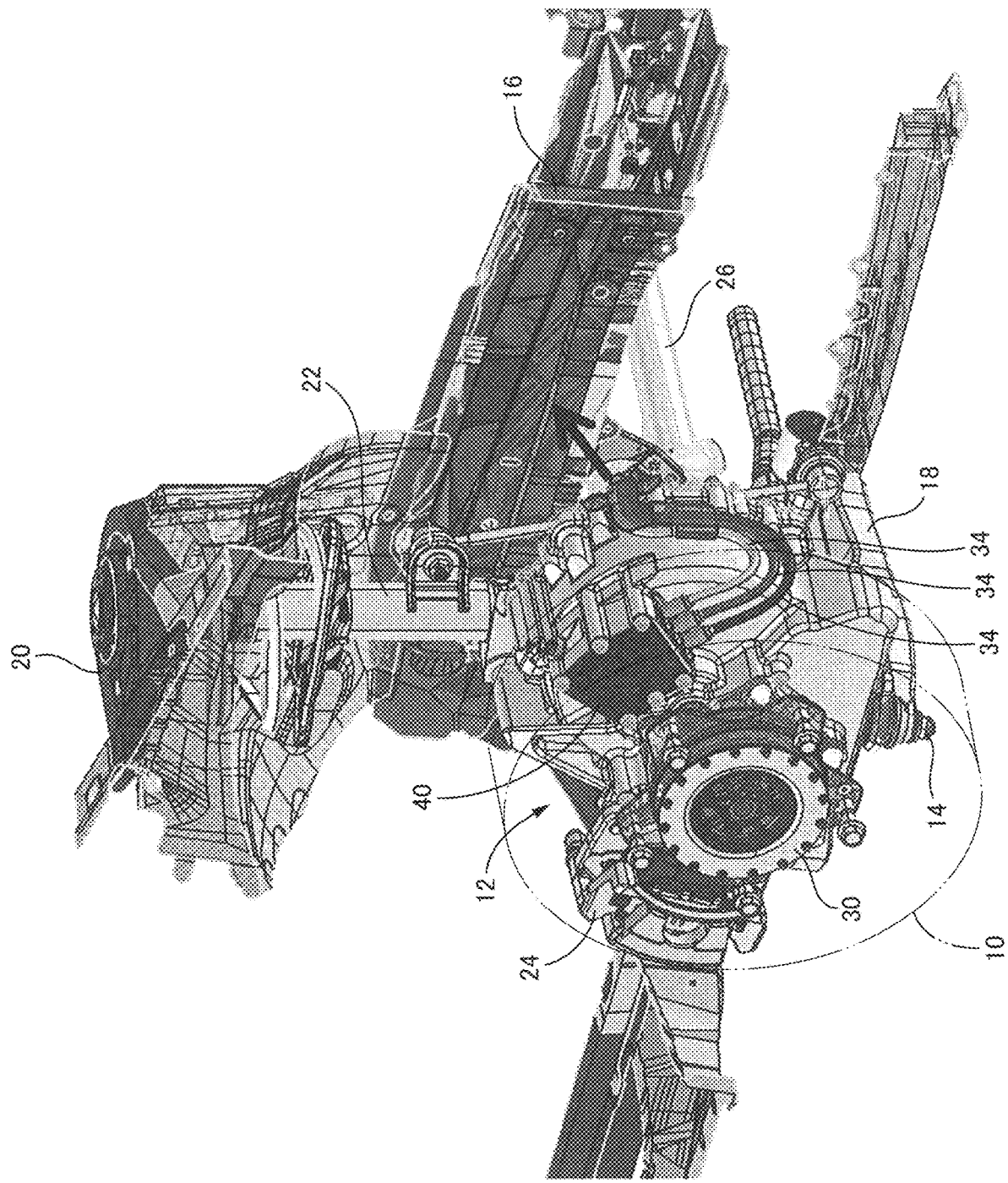
FIG. 1 is a perspective view illustrating a state in which an electric motor is disposed in a vehicle while a cable connecting structure according to one embodiment is employed.

The cable connecting structure according to the present disclosure is employable both for connecting the power supplying cable to the terminal-block-side terminal in the terminal block provided on the electric-motor side and for connecting the power supplying cable to the terminal-block-side terminal in the terminal block provided on the power-source side. In the former case, the electric discharge that arises from power supply from the power source is prevented. In the latter case, the electric discharge that arises from an electromotive force generated when the electric motor is rotating is prevented.

The cable connecting structure according to the present disclosure will be explained in relation to disconnection of the conductive wire and the terminal-block-side terminal from each other. According to the present cable connecting structure, the distal end of the power supplying cable is prevented from coming into contact with other component of the vehicle even if the power supplying cable is withdrawn from the terminal block in any of a situation in which the cable-side terminal is removed from the terminal-block-side terminal, a situation in which the conductive wire is removed from the cable-side terminal, a situation in which the cable-side terminal is broken, and a situation in which the distal end portion of the conductive wire is broken.

One end of the protective cover is fixed whereas the other end of the protective cover is held in engagement with the terminal block. The other end of the protective cover may be kept in engagement with the terminal block when the power supplying cable is withdrawn from the terminal block. Alternatively, the other end of the protective cover may be disengaged from the terminal block when the power supplying cable is withdrawn from the terminal block. In the former case, the protective cover may be configured to extend by a force by which the power supplying cable is withdrawn. Also in the latter case, the protective cover may be configured to extend by the force by which the power supplying cable is withdrawn if the other end of the protective cover is configured to be disengaged from the terminal block when the power supplying cable is withdrawn to a certain extent.

On the other hand, the protective cover may be configured to extend by its own elastic reaction force, irrespective of at which stage the engagement of the other end of the power supplying cable with the terminal block is cancelled. Specifically, the cable-side terminal of the power supplying cable and the terminal-block-side terminal of the terminal block may be fastened in a state in which the protective cover is contracted with elastic deformation, and the protective cover itself may extend by its own elastic reaction force when the conductive wire and the terminal-block-side terminal are disconnected from each other. In such a configuration, at least a part of the protective cover may be formed of a substantial elastic member, namely, a member having an appropriate spring constant. Alternatively, in the case where the protective cover is constituted by a plurality of component parts, at least one of the component parts may be formed of the substantial elastic member having an appropriate spring constant.

The protective cover may have a telescopic structure, for instance, in which a plurality of cylindrical members are slipped over or superposed on one another. The length of the thus structured protective cover may be changed by a relative movement of the plurality of cylindrical members. Instead, the protective cover may have a bellows structure. The bellows structure allows, in a simple configuration, a relatively large difference in the length of the protective cover between its contracted state and its extended state. Further, the bellows structure allows the protective cover to have flexibility for permitting the power supplying cable to move in dependence on its flexibility. That is, owing to the bellows structure, it is possible to provide, in a simple configuration, the protective cover that allows a sufficiently large difference in its length between the contracted state and the extended state and that does not hinder the movement of the power supplying cable.

When the power supplying cable is withdrawn from the terminal block, the distal end of the power supplying cable is positioned in an inner space of the extended protective cover. In this instance, it is expected that the distal end of the power supplying cable comes into contact with an inner circumferential surface of the protective cover, and it is expected that an outer circumferential surface of the protective cover comes into contact with other component of the vehicle with the inner circumferential surface kept in contact with the distal end of the power supplying cable. In view of such a situation, it is preferable that the protective cover have electric insulation between the inner circumferential surface and the outer circumferential surface for preventing an electric discharge via the protective cover.

The cable connecting structure according to the present disclosure may be employed for the electric motor configured to drivingly rotate the wheel to be steered or for an electric motor configured to drivingly rotate a wheel not to be steered. In the former case, namely, in the case where the wheel is a steerable wheel, a change in a relative position between the electric motor and the body of the vehicle is large, thus resulting in a high possibility of application of an excessive force to the power supplying cable. Accordingly, employment of the present cable connecting structure is highly advantageous in the former case.

DETAILED DESCRIPTION OF THE EMBODIMENT

Referring to the drawings, there will be explained in detail a cable connecting structure according to one embodiment of the disclosure. It is to be understood that the cable connecting structure according to the disclosure is not limited to the details of the following embodiment but may be changed and modified based on the knowledge of those skilled in the art.

Figure 2:
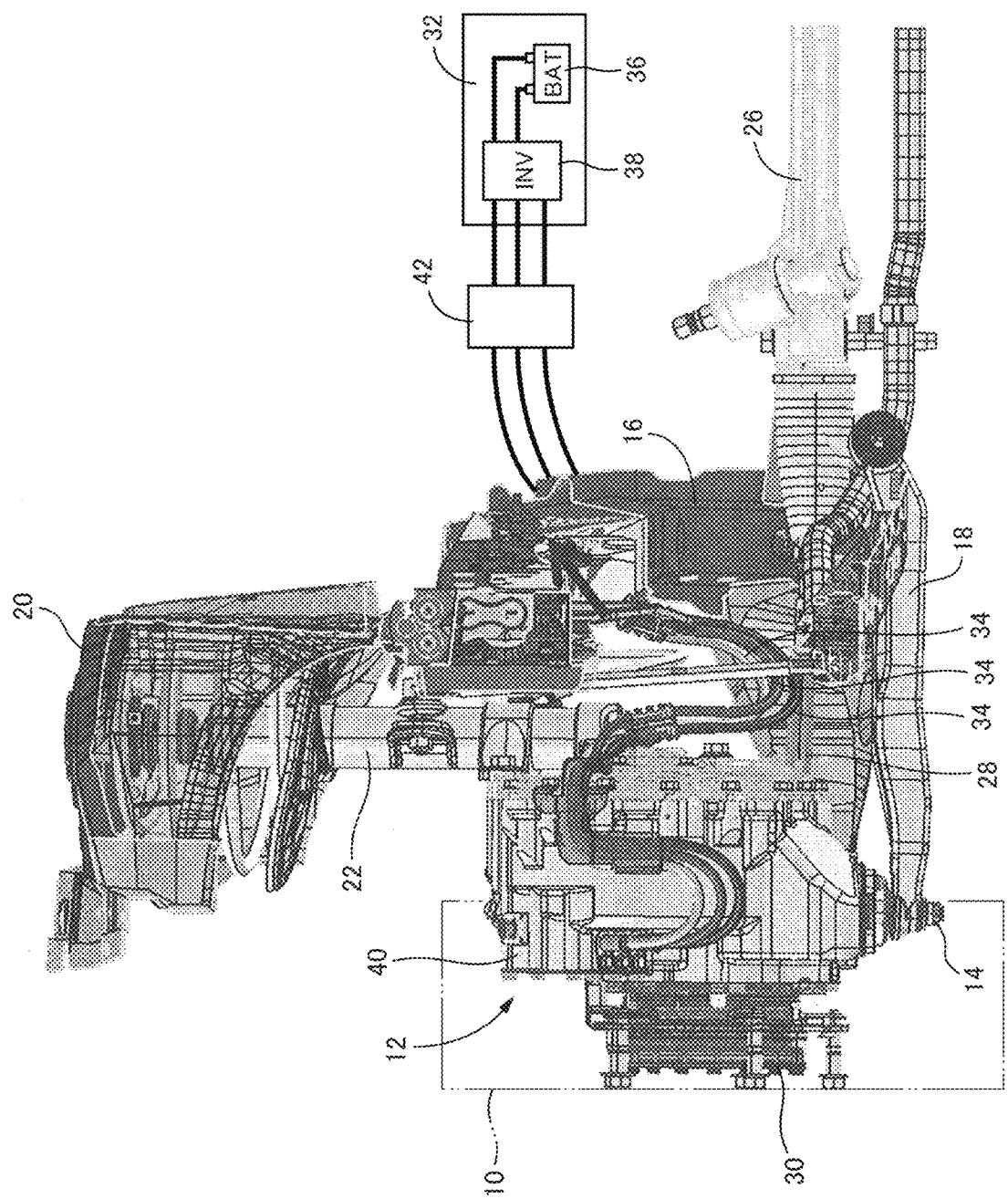
FIG. 2 is a perspective view illustrating the state in which the electric motor is disposed in the vehicle while the cable connecting structure according to the embodiment is employed, the view being seen from a viewpoint different from FIG. 1.

FIGS. 1 and 2 are views each illustrating a state in which an electric motor 12, which is disposed in a wheel 10 indicated by the long dashed double-short dashed line, is installed on a vehicle. The electric motor 12 will be hereinafter simply referred to as "motor 12" where appropriate. FIG. 1 shows the state viewed from an obliquely rear side of the vehicle while FIG. 2 shows the state viewed from a rear side of the vehicle. The motor 12 is an in-wheel motor. The motor 12 as the in-wheel motor holds the wheel 10 and incorporates a speed reducer, so as to drivingly rotate the wheel 10.

The wheel 10 illustrated in FIGS. 1 and 2 is a front left wheel of a four-wheel vehicle, i.e., a steerable wheel. The motor 12, specifically, a housing of the motor 12, functions as a steering knuckle in a strut-type (MacPherson-type) suspension apparatus. The housing of the motor 12 is supported, at its lower end, by one end of a lower arm 18 whose another end is supported by a side member 16 of a body of the vehicle. (Only a part of the side member 16 is illustrated). The housing of the motor 12 is supported by the one end of the lower arm 18 via a ball joint 14. The housing of the motor 12 holds, at its side surface on a vehicle-body side, a lower end portion of a shock absorber 22 whose upper end is supported by a mount portion 20 of the vehicle body. Further, the housing of the motor 12 holds a brake caliper 24 at its front portion. The housing of the motor 12 is connected, via a link rod 28, to one of opposite ends of a steering rod of a steering device 26. When the motor 12 is rotated, an axle hub 30 is rotated. The wheel 10 is coupled to the axle hub 30 with a brake disc (not shown).

The motor 12 is a three-phase brushless motor. There is supplied, to the motor 12, an electric current from a power source 32 (schematically illustrated in FIG. 2) provided on the vehicle body via three power supplying cables 34 (hereinafter each simply referred to as "cable 34" where appropriate). In this respect, the power source 32 is constituted by a battery 36 and an inverter 38 as a drive circuit.

A terminal block 40 is attached to the housing of the motor 12. A terminal block 42 similar to the terminal block 40 is attached to the vehicle body. Each of the cables 34 is connected at its opposite ends to the terminal blocks 40, 42 such that the cable 34 extends, in a slackened state, between the two terminal blocks 40, 42.

Figure 3A:
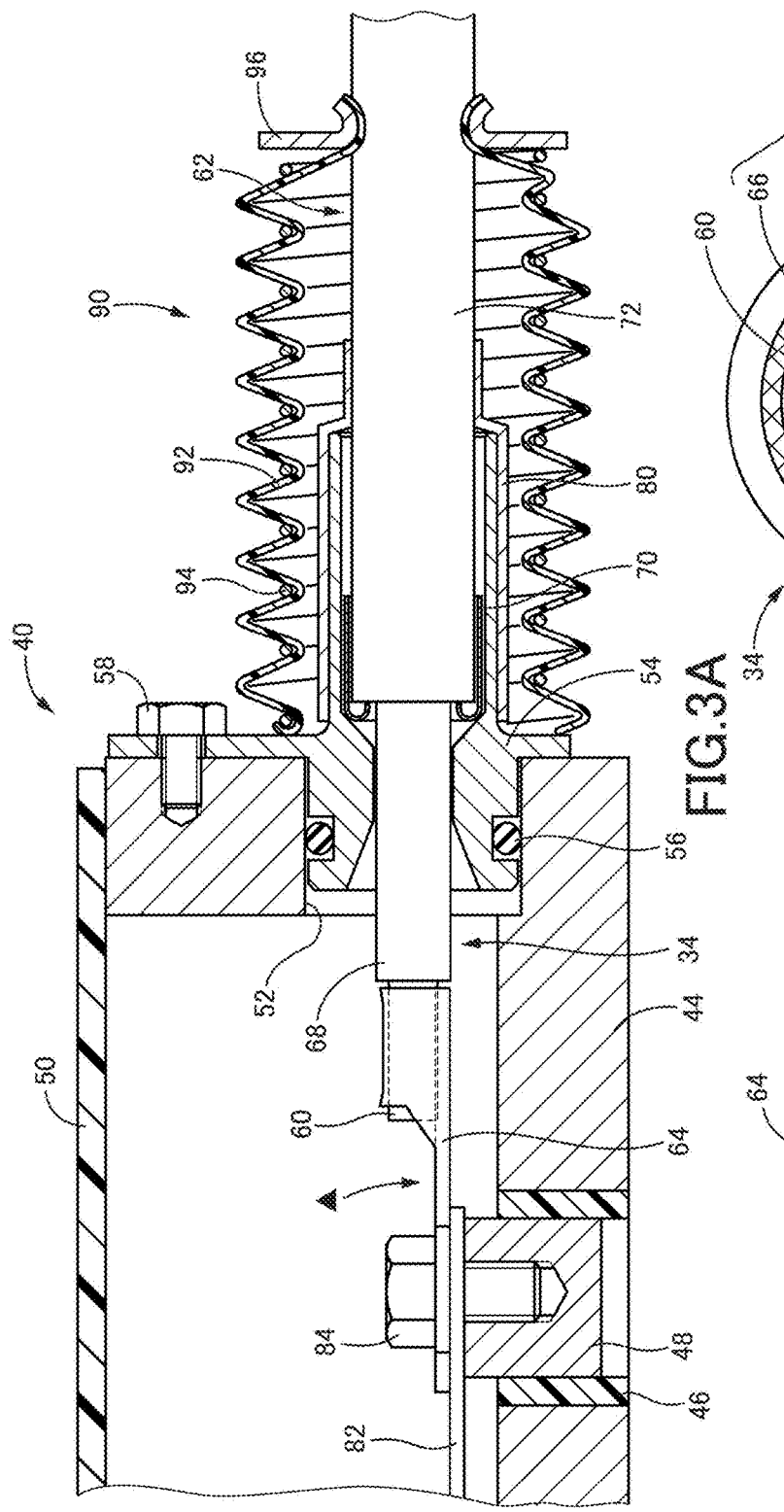
FIGS. 3A-3C are views each for explaining the cable connecting structure according to the embodiment for connecting a power supplying cable to a terminal in a terminal block provided on an electric-motor side.
Figure 3B:
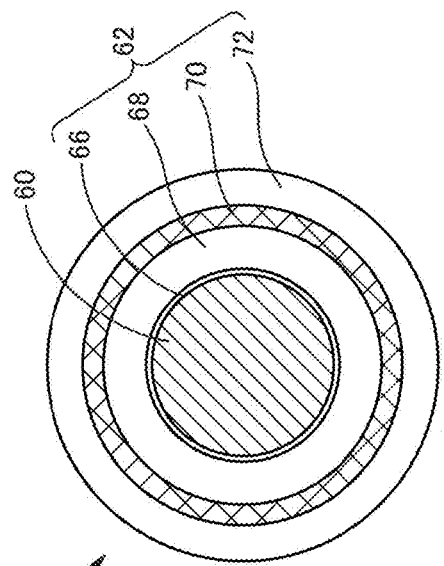
Figure 3C:
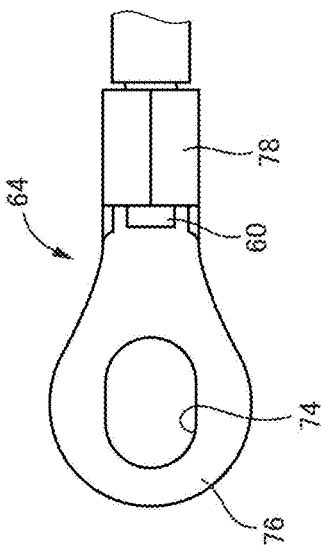

Referring to FIGS. 3A-3C, the connection of each cable 34 to the terminal blocks 40, 42 will be explained by taking the terminal block 40 provided on the motor side (12) as an example. As shown in FIG. 3A, the terminal block 40 includes a block body 44 formed of an aluminum alloy and shaped like a box that is open upward, a terminal seat 48 formed of steel and fixed to a bottom wall of the block body 44 via a collar 46 formed of a resin, a lid 50 that is formed of a resin and that closes the opening of the block body 44, and a flanged sleeve 54 formed of an aluminum alloy and fitted in a retaining hole 52 formed in a side wall of the block body 44. An 0 ring 56 as a sealing member is interposed between an outer circumferential surface of the sleeve 54 and an inner circumferential surface of the retaining hole 52. The sleeve 54 is fixedly fastened, at its flange, to the block body 44 by a bolt 58.

The cable 34 will be explained referring also to FIG. 3B schematically illustrating a cross section of the cable 34. The cable 34 is constituted by a wire 60 as a conductive wire formed by twisting copper wires, a covering 62 surrounding the wire 60, and a terminal 64 attached to a distal end portion of the wire 60, i.e., a left end portion of the wire 60 in FIG. 3A. The covering 62 has a multilayer structure. The multilayer structure of the covering 62 will be explained sequentially from an innermost layer toward an outermost layer. That is, the multilayer structure includes: an innermost separator 66 formed of fluororesin and contacting the wire 60; an insulating tube 68 formed of fluororesin and functioning as an insulating layer; a cylindrical braided tube 70 formed by braiding copper wires and functioning as an electromagnetic shield; and a sheath 72 formed of a heat-resistant vinyl and positioned at the outermost position so as to exert a protecting function. The distal end portion of the wire 60 is not covered by the covering 62. In other words, the covering 62 is stripped off at the distal end portion of the wire 60, and the terminal 64 is attached to the distal end portion. As shown in FIG. 3C, the terminal 64 includes: a flat plate portion 76 having a central hole 74; and a tube-like portion 78 which is formed so as to be continuous to the flat plate portion 76 and into which the wire 60 is inserted. The terminal 64 is attached to the wire 60 by swaging the tube-like portion 78.

The cable 34 is inserted into the sleeve 54, and the terminal 64 is then attached to the wire 60. The sleeve 54 has a stepped inner circumferential surface. The covering 62 of the cable 34 is stepwise stripped off on its distal-end side so as to conform to the steeped inner circumferential surface of the sleeve 54. Specifically, the entirety of the covering 62 is stripped off at a terminal-attached portion of the cable 34 to which the terminal 64 is attached. Only the braided tube 70 and the sheath 72 are stripped off at a near-terminal portion of the cable 34 continuous to the terminal-attached portion and near to the terminal 64. The near-terminal portion of the cable 34 at which only the braided tube 70 and the sheath 72 are stripped off is positioned in a small-inner-diameter portion of the sleeve 54, and other portion of the cable 34 continuous to the near-terminal portion is positioned in a large-inner-diameter portion of the sleeve 54. In this respect, the braided tube 70 is folded back on a portion of the cable 34 at which the entirety of the covering 62 remains without being stripped off. An adhesive is applied between an inner circumferential surface of the large-inner-diameter portion of the sleeve 54 and an outer circumferential surface of the cable 34 that is opposed to the inner circumferential surface. A protective sleeve 80 formed of steel is swaged to the cable 34, specifically, to the sheath 72 of the cable 34, such that the sleeve 54 is sandwiched by the outer circumferential surface of the cable 34 and an inner circumferential surface of the protective sleeve 80.

The terminal 64 is fastened by a bolt 84 to the terminal seat 48 together with a terminal 82 (that is shaped similarly to the terminal 64) of a wire extending into the motor 12, i.e., an internal wire of the motor 12. That is, the terminal 64 for the cable 34 (the cable-side terminal) and the terminal 82 for the motor 12 (the motor-side terminal) are fastened to each other. In this respect, the terminal 82 and the terminal seat 48 may be defined as a terminal-block-side terminal that is a terminal provided in the terminal block 40. Based on this definition, it may be considered that the wire 60 is connected to the terminal-block-side terminal via the terminal 64 by fastening the terminal-block-side terminal and the terminal 64 that is the cable-side terminal.

In the cable connecting structure, a cylindrical protective cover 90 is provided outside the terminal block 40 for allowing the cable 34 to be disposed therein. The protective cover 90 is constituted by a boot 92 that is a resin-made spiral bellows and a coil spring 94 (hereinafter simply referred to as "spring 94" where appropriate). That is, the protective cover 90 has a bellows structure. The spring 94 is provided on the outer circumferential portion of the boot 92 such that the wire of the spring 94 extends along valleys of the bellows. Though the boot 92 may be formed of any resin material, the resin employed in the present cable connecting structure is an olefin thermoplastic elastomer. Specifically, the resin for the boot 92 is an elastomer composed of a dispersed phase of an olefin rubber (EPDM, EPR) responsible for rubber elasticity and a matrix phase of a PP resin for preventing plastic deformation. Because the elastomer assumes rubber elasticity at room temperature and plastic flowability (thermoplasticity) at high temperatures, the elastomer is readily formable and processible.

The protective cover 90 is fixed, at its proximal end (i.e., right-side end in FIG. 3A) to the covering 62 of the cable 34 by a doughnut-shaped (perforated disc like) retainer 96 formed of metal. That is, the protective cover 90 is fixed to the covering 62 such that one end of the boot 92 is swaged with the retainer 96. A proximal end of the spring 94 is supported by the retainer 96. At a distal end (i.e., left-side end in FIG. 3A) of the protective cover 90, a distal end of the boot 92 is wound on and fixed to a distal end of the spring 94. Both of the distal end of the boot 92 and the distal end of the spring 94 are held in engagement or contact with the flange of the sleeve 54 of the terminal block 40.

The protective cover 90 is disposed between the retainer 96 and the flange of the sleeve 54. The boot 92 and the spring 94 of the protective cover 90 are both in a compressively deformed state. That is, the protective cover 90 is disposed in a compressed state. It is noted that the boot 92 and the spring 94 are both elastic members and that the protective cover 90 has the bellows structure. Thus, the protective cover 90 does not hinder a flexible movement of the cable 34 that results from a relative movement of the wheel 10 and the vehicle body.

FIG. 4A illustrates an external appearance of the cable connecting structure. When the vehicle collides, for instance, the cable 34 receives an excessive pulling force, namely, a force by which the cable 34 is withdrawn from the terminal block 40 (i.e., a force indicated by the while arrow in FIG. 4A). When this force becomes large beyond the adhesive strength between the sleeve 54 and the covering 62 of the cable 34, it is expected that the wire 60 (the conductive wire) of the cable 34 is disconnected from the terminal-block-side terminal constituted by the terminal seat 48 and the terminal 82 for the motor 12, as is understood from FIG. 3A. More specifically, it is expected that the wire 60 is withdrawn from the terminal 64 for the cable 34 or the terminal 64 itself is broken at its weak or fragile portion indicated by "▲" in FIG. 3A. In the case where the wire 60 is thus disconnected, the cable 34 is withdrawn from the terminal block 40, as shown in FIG. 4B.

In the case where the cable 34 is withdrawn from the terminal block 40, the engagement of the distal end of the protective cover 90 with the terminal block 40 is cancelled, namely, the distal end of the protective cover 90 moves away from the sleeve 54 of the terminal block 40, as shown in FIG. 4B, and the protective cover 90 that has been compressed extends by its own elastic reaction force. Specifically, the protective cover 90 is extended by the elastic reaction force of the boot 92 and the spring 94 such that the distal end of the protective cover 90 goes beyond the distal end 98 of the cable 34 indicated by the long dashed double-short dashed line.

Here, a case is considered in which the protective cover 90 is not provided. The voltage is being applied to the distal end 98 of the cable 34 from the power source 32. If the distal end 98 comes into contact with some portion, member, component, etc., of the vehicle, the electric discharge may occur at the distal end 98 because the distal end 98 of the cable 34 is not covered with the covering 92. Depending on circumstances, sparks may be generated at the distal end 98. It is preferable that such electric discharge be prevented because it adversely influences devices of the vehicle, for instance.

According to the present cable connecting structure, even when the cable 34 is withdrawn from the terminal block 40, the electric discharge described above is obviated owing to the protective cover 90 configured to extend. In this respect, even if the distal end 98 of the withdrawn cable 34 comes into contact with some portion, member, component, etc., of the vehicle, via the protective cover 90, the electric discharge via the protective cover 90 is prevented because the boot 92 of the protective cover 90 is formed of the resin, in other words, the boot 92 is an insulatior. That is, the protective cover 90 has electric insulation between the inner circumferential surface and the outer circumferential surface thereof, thus preventing the electric discharge via the protective cover 90.

The explanation above is made for connection between: the terminal block 40 for the motor 12; and the cable 34. The same connecting structure is employed for connection between: the terminal block 42 for the power source 32; and the cable 34. Thus, in the case where the cable 34 is withdrawn from the terminal block 42, it is possible to prevent occurrence of the electric discharge that arises from an electromotive force generated in the motor 12 by rotation of the wheel 10.

The cable connecting structure illustrated above employs the protective cover 90 constituted by the resin-made boot 92 and the metallic spring 94. For instance, a protective cover not including the spring may be employed as long as sufficient extension of the protective cover can be ensured only by the elastic reaction force of the boot.

Moreover, the cable connecting structure may employ a protective cover configured to extend without depending on its own elastic reaction force. For instance, if the protective cover is arranged such that the engagement of its distal end with the terminal block is canceled at a time point when the protective cover has been sufficiently extended, it is possible to extend the protective cover by the force by which the cable is withdrawn from the terminal block.

What is claimed is:

1. A cable connecting structure for a power supplying cable used for supplying an electric current from a power source provided on a body of a vehicle to an electric motor that is disposed in a wheel of the vehicle and that is configured to drivingly rotate the wheel, the cable connecting structure being for connecting the power supplying cable to a terminal-block-side terminal in a terminal block provided on one of an electric-motor side and a power-source side, wherein the power supplying cable includes a conductive wire, a covering that covers the conductive wire except for a distal end portion of the conductive wire, and a cable-side terminal attached to the distal end portion of the conductive wire, the conductive wire being connected to the terminal-block-side terminal such that the cable-side terminal and the terminal-block-side terminal are fastened to each other, wherein a protective cover having a cylindrical shape is provided so as to allow the power supplying cable to be disposed therein in a state in which the protective cover is contracted while one end of the protective cover is fixed to the covering outside the terminal block and the other end of the protective cover is held in engagement with the terminal block, and wherein, when the conductive wire and the terminal-block-side terminal are disconnected from each other and the power supplying cable is accordingly withdrawn from the terminal block, the protective cover extends such that the other end thereof goes beyond a distal end of the power supplying cable.

2. The cable connecting structure according to claim 1, wherein the protective cover is configured to extend by its elastic reaction force.

3. The cable connecting structure according to claim 1, wherein the protective cover has a bellows structure.

4. The cable connecting structure according to claim 1, wherein the protective cover has electric insulation between its inner circumferential surface and its outer circumferential surface.

5. The cable connecting structure according to claim 1, wherein the wheel is a steerable wheel to be steered.

* * * * *